(12) United States Patent
Watanabe et al.

(10) Patent No.: US 6,420,883 B1
(45) Date of Patent: Jul. 16, 2002

(54) SEMICONDUCTOR INTEGRATED CIRCUIT DEVICE AND IC CARD

(75) Inventors: Kazuki Watanabe, Kokubunji; Ryouzou Yoshino, Hadano; Kenji Nagai, Iruma; Tatsuya Nishihara, Koganei, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/427,594

(22) Filed: Oct. 27, 1999

(30) Foreign Application Priority Data

Oct. 30, 1998 (JP) ............................................. 10-309850

(51) Int. Cl.[7] ......................... G01R 27/08; H01L 21/00
(52) U.S. Cl. ...................... 324/691; 324/537; 324/73.1; 438/11
(58) Field of Search ................... 324/73.1, 719, 324/537, 691; 257/536, 315; 438/17, 11

(56) References Cited

U.S. PATENT DOCUMENTS 5,300,837 A * 4/1994 Fischer ...................... 307/491
6,072,328 A * 6/2000 Takuma ........................ 326/8
6,114,900 A * 9/2000 Yamaguchi ................. 327/541
6,188,112 B1 * 2/2001 Bryant ........................ 257/379

FOREIGN PATENT DOCUMENTS

| JP | 63-87736 |   | 4/1988 |
| JP | 3-1439 | * | 5/1989 |
| JP | 1-232756 |   | 9/1989 |
| JP | 3-1439 |   | 1/1991 |
| JP | 4-173194 |   | 6/1992 |
| JP | 6-244254 |   | 9/1994 |

* cited by examiner

*Primary Examiner*—Michael J. Sherry
*Assistant Examiner*—Paresh Patel
(74) *Attorney, Agent, or Firm*—Mattingly, Stanger & Malur, P.C.

(57) ABSTRACT

A semiconductor integrated circuit device provided with an IC chip so as to prevent its circuits from malfunction when the IC chip is cracked. To detect chip cracks, a resistor R01 is disposed at the outer periphery of the area which wants to detect the chip crack. If the chip is cracked and the resistance value of the resistor R01 is changed, the resistance change is detected, thereby controlling internal signals such as the power on reset signal and stopping the whole operation of the circuit device so as to prevent the circuits from malfunction. Thus, the system security can also be improved.

6 Claims, 10 Drawing Sheets

SEMICONDUCTOR INTEGRATED CIRCUIT DEVICE AND IC CARD

FIELD OF THE INVENTION

The present invention relates to a semiconductor integrated circuit device, more particularly to a technique for preventing the device from malfunction when its IC chip cracks.

BACKGROUND OF THE INVENTION

Recently, "IC cards" each of which employs a semiconductor integrated circuit device, have come into widespread use. An IC card has various functions equivalent to those realized by a magnetic card at present, for example, exchanging data with a reader/writer through the semiconductor integrated circuit device mounted thereon.

Some IC card are protected from chip cracks with the use of various techniques, to thicken the IC card itself in structure for avoiding a stress to be applied onto the chip thereof, to compose the IC card so as to avoid a stress to be applied onto the chip itself, and/or to reinforce the chip with a board.

SUMMARY OF THE INVENTION

Along with the popularization of the IC cards, a demand for thinner IC cards is increasing. This also creates the demand for thinner IC chips used in the IC card, and confronting with a problem that the chips become weak in shock resistance and tends to be easily cracked. All the circuits of an IC card are in disabled condition when the chip is cracked, still no problem will arise. There is the problem of malfunction of the chip, caused by the coexistence of active and inactive circuits under the cracked chip.

In particular, an IC chip is often mounted on an IC card so as to come in close contact with the principal part of the card. So, unlike a case in which the chip is pinned on a board, a part of the chip continues an imperfect operation even after the chip is cracked. Concretely, the chip used as a single unit is cracked to pieces, then the chip will be disabled for operation. The chip used as a part of an IC card, however, might continue its operation on the cracked chip. Imperfect operation of the chip due to this is serious problem especially in the use of the IC card for security and cashing.

Under the circumstances, the present invention aims to provide a semiconductor integrated circuit device that never malfunctions when the chip is cracked.

The Japanese Patent Laid-Open No.6-244254 discloses a technique for detecting defective chips including circuit element cracks. In the technique, a conductor pattern is formed on the surface of a circuit element, then a pad for measurement is formed on this pattern. Then, the resistance variation of the pattern is measured from outside, thereby selecting defective chips.

This technique is intended to select defective chips, not intended for chip cracked after shipping. In the case of an IC card to which the present invention is expected to be applied, the chip is often damaged through in actual practice. The present invention, thus, aims to surely avoid a chip malfunction caused by the cracked chip brought about through in actual practice.

DETAILED DESCRIPTION OF THE PREFERRED EMBODIMENTS

Figure 1:
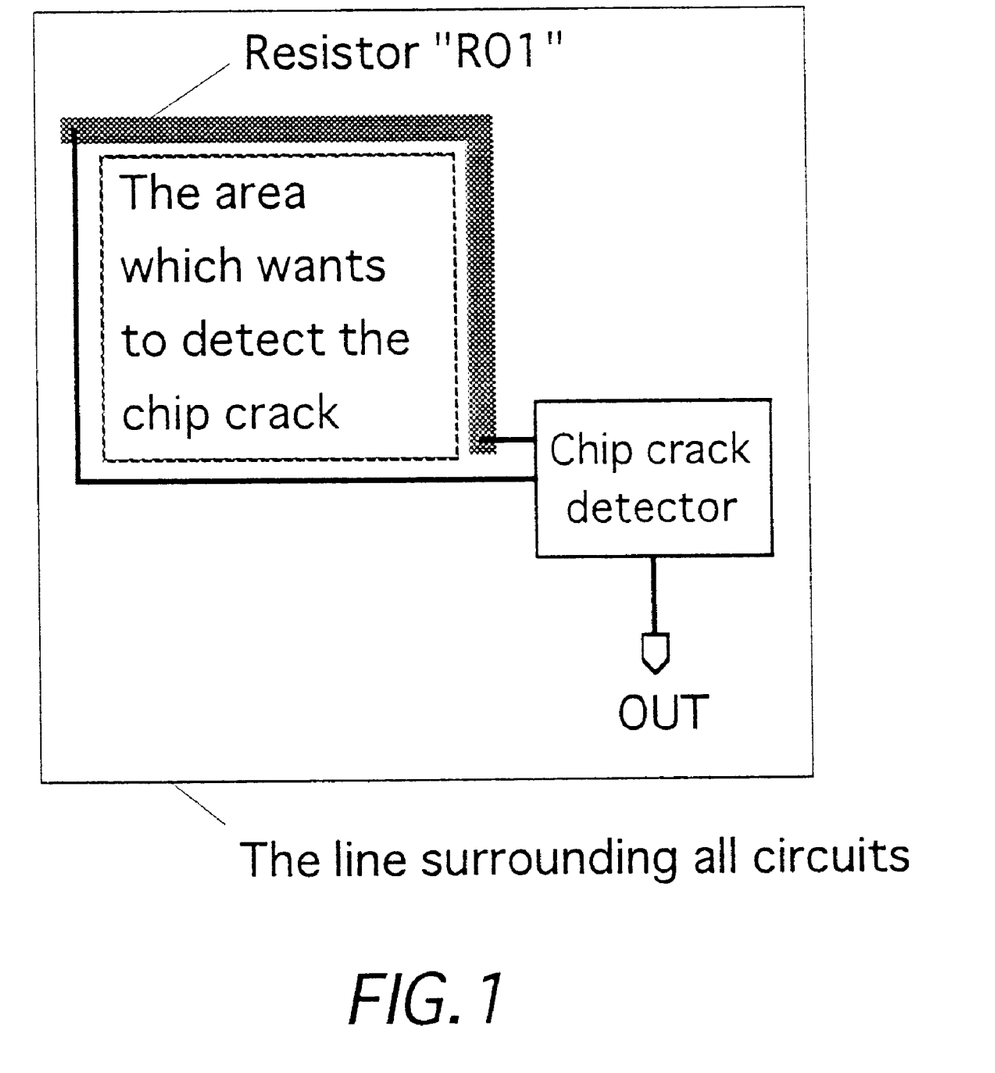
FIG. 1 is a layout for disposing a resistor for detecting chip cracks on an IC card chip.

Hereunder, the preferred embodiments of the present invention will be described with reference to the accompanying drawings. FIG. 1 shows how to dispose a resistor for a chip crack detector of the present invention. In a semiconductor integrated circuit device on which transistors, resistors, etc. are formed on one and the same silicon wafer chip, one or more resistors R01 are disposed at least at two sides of the outer periphery of the area which wants to detect the chip crack. The resistors R01 are used to detect chip cracks. In FIG. 1, a resistor is disposed so as to go round a part of the inner circuit, but the resistor may be disposed at the line surrounding all circuits. The line surrounding all circuits means an area outside a circuit block provided with a logic circuit, for example.

Figure 2:
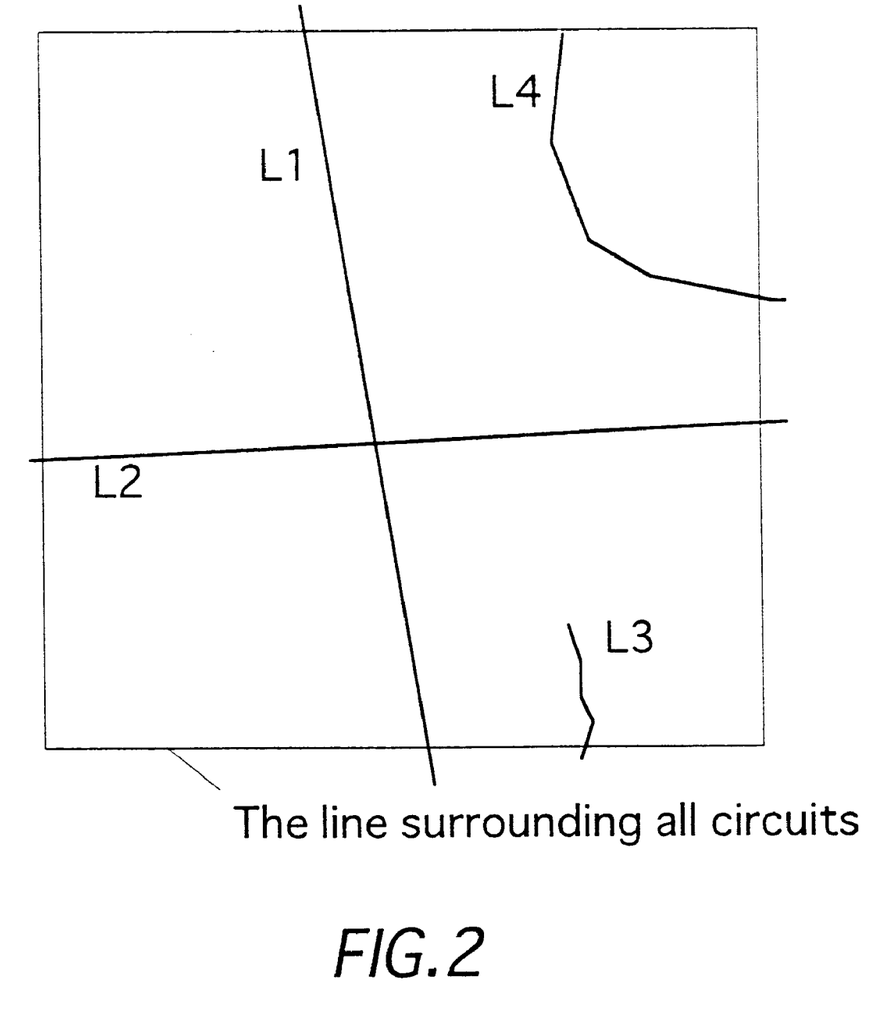
FIG. 2 is a top view of a cracked chip.

FIG. 2 shows an explanatory view of chip cracks caused by a shock from outside the chip. Like L1 and L2, a chip is often cracked in the directions of the y axis or the x axis. Consequently, a resistor R01 must be disposed at least at each side of the chip in the directions of the y and x axes of the area which wants to detect the chip crack. To meet the case where a chip might be cracked or chipped like L3 and L4, the resistor R01 should preferably be disposed so as to surround the area which wants to detect the chip crack, and thereby detecting chip defects including cracks and chips.

If the chip is cracked, the resistance value of the resistor R01 disposed such way rises at the cracked portion. The resistance value of the resistor R01 also rises. The voltage and current changes are thus detected based on the change of the resistance value of the resistor R01, caused by the chip crack, thereby detecting a chip crack and further preventing the chip from malfunction.

Figure 3:
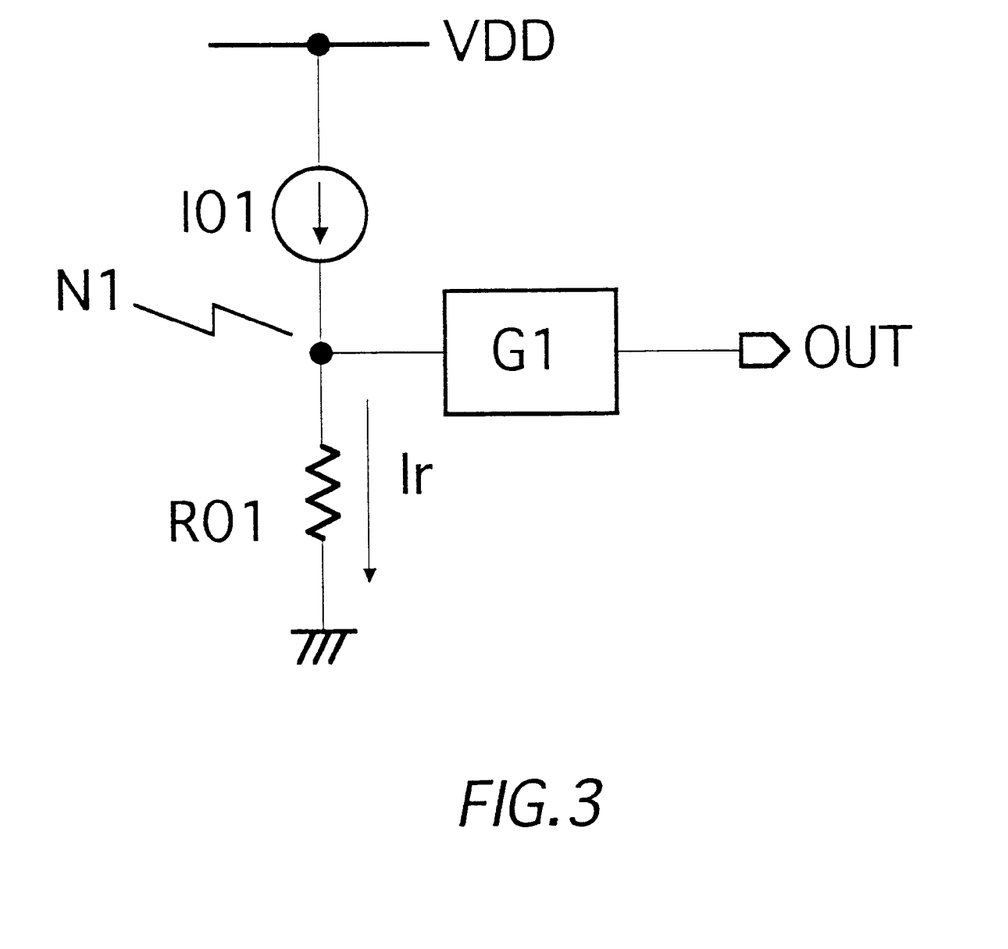
FIG. 3 is a circuit diagram of a basic configuration of a chip crack detector.

FIG. 3 shows a basic configuration of the chip crack detector which uses the resistor R01 described above. In this configuration, a current source I01 and a resistor R01 are connected serially to each other between the power supply voltage terminal VDD and the ground terminal. The node N1 is connected to the input terminal of the detector G1. Note that the current source I01 should preferably be a constant current source for easier controlling.

In this circuit, the voltage VN1 of the connecting point N1 is decided by the product between the resistor R01 and the current Ir of the current source I01. The resistor R01 and the current source I01 are set to VN1<Vt in case where the chip is not cracked, and set to VN1>Vt in case where the chip is cracked. The Vt means a detection level of the detector G1. In this setting, the detector G1 outputs "H" when the chip is not cracked and "L" when the chip is cracked. Chip cracks can thus be detected surely.

Figure 4:
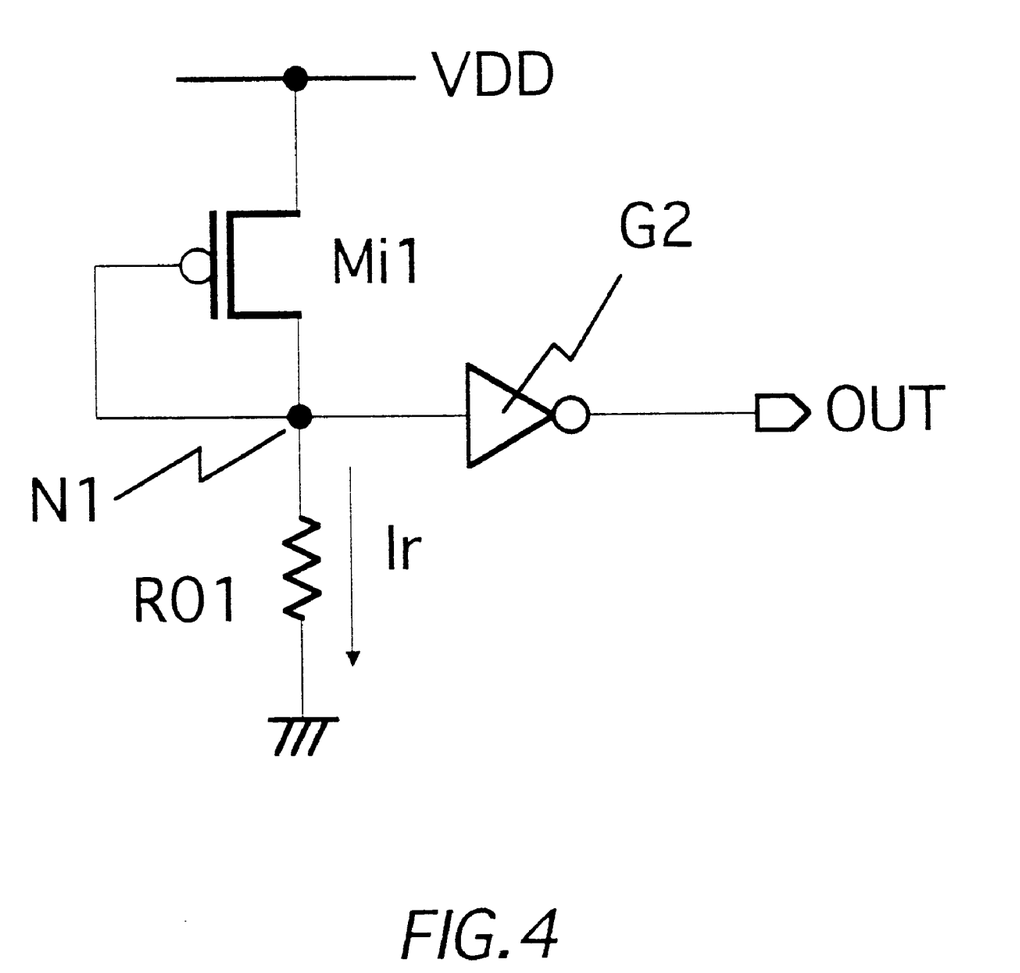
FIG. 4 is a circuit diagram of the chip crack detector in the first embodiment.

FIG. 4 shows the first embodiment of the chip crack detector. Basically, the configuration of the detector is the same as that shown in FIG. 3. The current source I01 is composed of a PMOS transistor Mi1 in which the gate terminal is connected to the drain terminal. In this case, the detector is an inverter G2. The detector G1 shown in FIG. 3 can also be replaced with an inverter. The current source I01 can also be replaced with a constant current source in FIG. 4.

Figure 5:
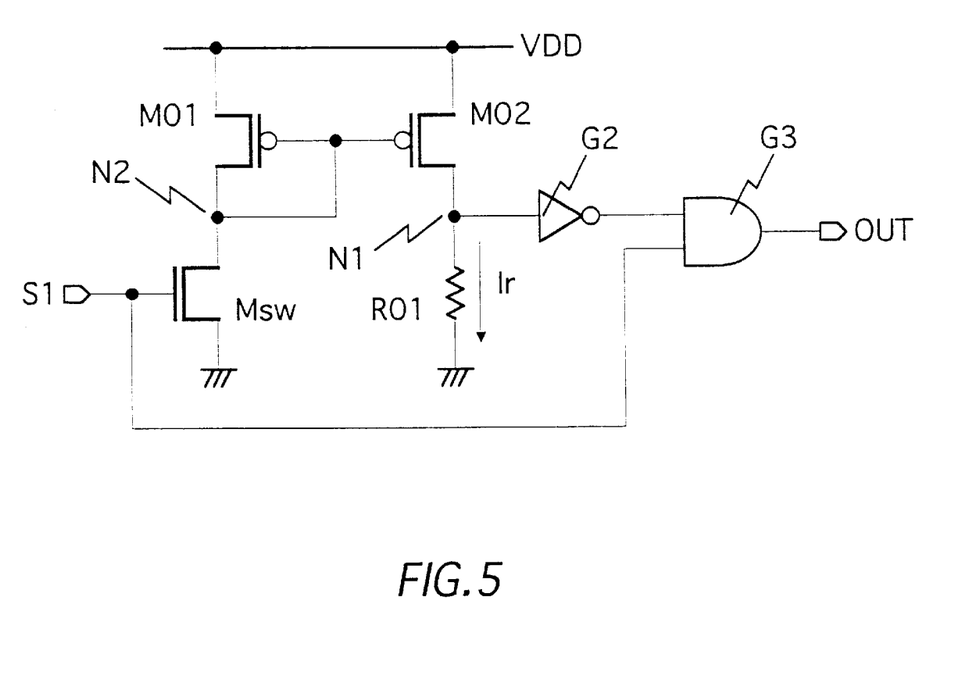
FIG. 5 is a circuit diagram of the chip crack detector in the second embodiment.

FIG. 5 shows the second example of the chip crack detector. A PMOS transistor M01 and an NMOS transistor Msw are connected serially to each other between the power supply voltage terminal VDD and the ground terminal. The gate terminal and the drain terminal are connected to each other in the PMOS transistor M01. A control signal S1 is entered to the gate terminal of the NMOS transistor Msw.

Furthermore, the PMOS transistor M02 and the resistor R01 are connected serially to each other between the power supply voltage terminal VDD and the ground terminal. The gate terminal of the PMOS transistor M02 is connected to the node N2 between the PMOS transistor M01 and the NMOS transistor Msw.

The node N1 between the PMOS transistor M02 and the resistor R01 is connected to the input terminal of the inverter G2. In addition, the output terminal of the inverter G2 and the control signal S1 are connected to the input terminals of the 2-input AND gate G3 respectively.

Figure 6:
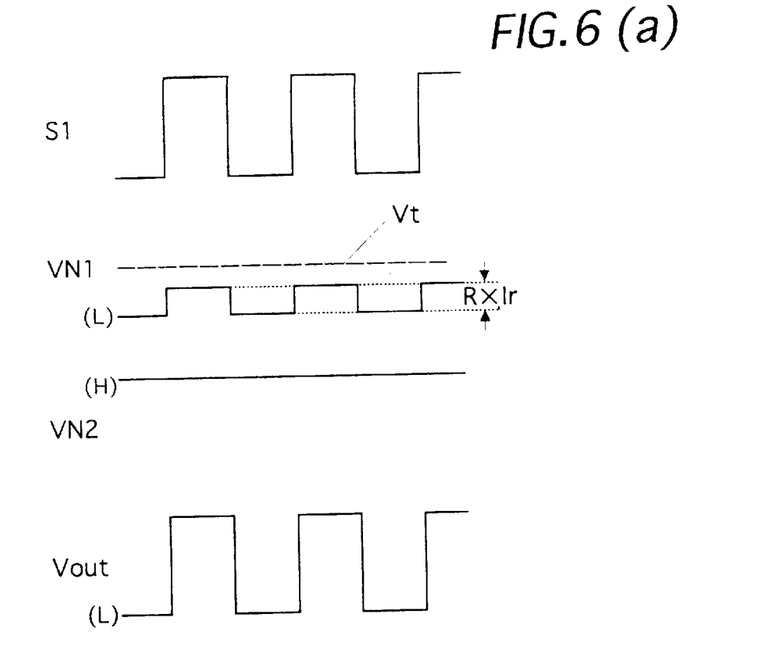
FIG. 6(a) shows operation waveforms output from the chip crack detector (in the second embodiment) for a normal chip (not cracked).
FIG. 6(b) shows operation waveforms output from the same for a cracked chip.

FIGS. 6(a) and (b) show the waveforms of the chip crack detection of the chip crack detector shown in FIG. 5. FIG. 6(a) shows the operation waveforms for detecting a normal chip. When the level of the input signal S1 is "H", the transistor Msw is turned on and the current Ir flows in the transistors M01 and M02 and the resistor R01, so that the voltage VN1 of the node N1 becomes a product between the resistance value R of the resistor R01 and the current Ir. At this time, if all the above items are set as described above, the relationship between the voltage VN1 and the detection level Vt becomes VN1<Vt, thereby the output of the inverter G2 becomes "H" and the output Vout of the 2-input AND gate G3 also becomes "H".

If the level of the input signal S1 is "L", the transistor Msw is turned off and no current flows in the transistors M1 and M02 and the resistor R01. Thus, the voltage VN1 becomes 0V and the output Vout becomes "L".

As described above, in the resistor R01, when the chip is not cracked, a signal equivalent to the control signal S1 is output to the Vout.

Next, FIG. 6(b) shows the operation waveforms output from the chip crack detector when the chip is cracked. When the chip is cracked, the resistance value of the resistor R01 becomes "a" times (a>1) the R value. At this time, if the level of the control signal S1 is "H" as shown in FIG. 6(b), the current Ir flows in the resistor R01 as described above. Then, the voltage VN1 becomes aR×Ir and the relationship between the voltage VN1 and the detection level Vt becomes VN1>Vt. Thus, the inverter G2 outputs "L" and the output Vout becomes "L".

If the level of the control signal S1 is "L", the Vout becomes "L" just like when the chip is not cracked.

If the resistor R01 is cracked and the resistance value of the resistor R01 becomes "a" times the R value, the Vout is fixed at "L" regardless of the level of the control signal S1.

If the chip is not cracked, the control signal S1 is output to the next circuit as it is. If the chip is cracked, the input in the next circuit can be fixed to "L", thereby stopping the circuit operation.

In this case, the control signal S1 of the chip crack detector can be replaced with a power on reset signal. The power on reset signal is a signal for initializing the logic of an IC just after the IC is powered. If the object chip is cracked and the resistance value rises in the above configuration, no power on reset signal is entered. Thus, the system is not started at all, so that no malfunction occurs in the system. In addition, because this circuit is driven only when the system is reset, the power consumption for detecting chip cracks can be minimized favorably.

Figure 7:
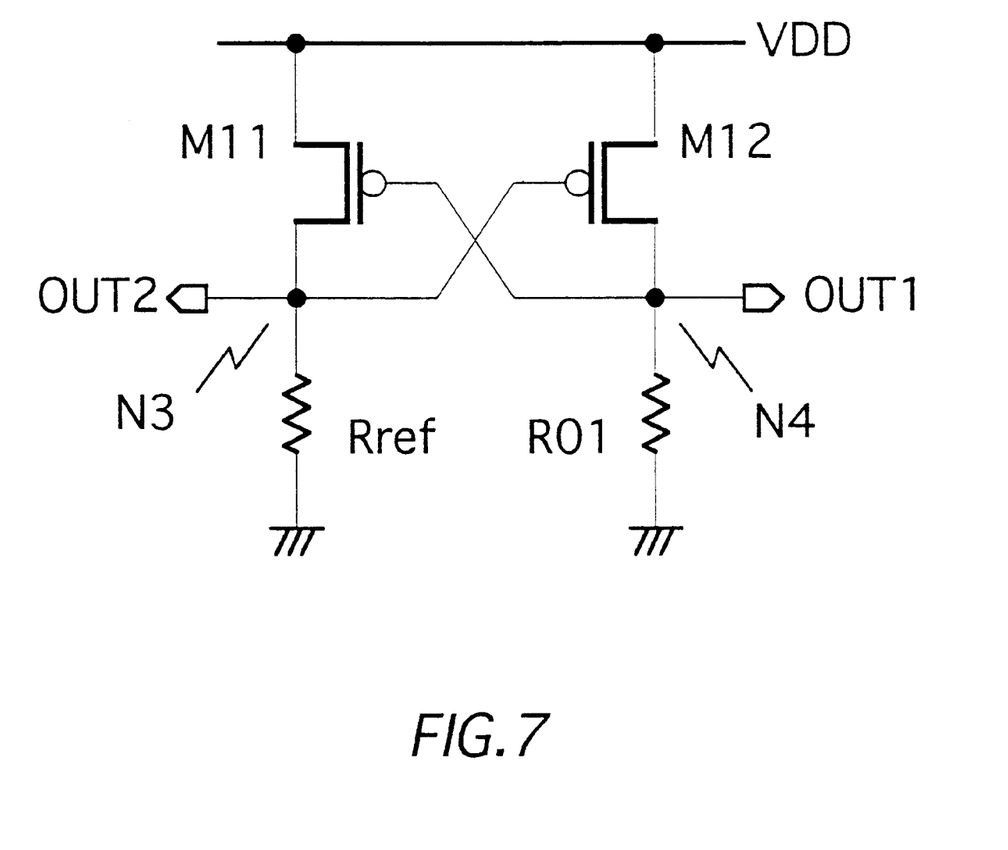
FIG. 7 is a circuit diagram of the chip crack detector in the third embodiment.

FIG. 7 shows the third example of the chip crack detector. In this example, the drain terminal of the PMOS transistor M11 is connected to the resistor Rref at the node N3 between the power supply voltage VDD and the ground terminal. In the same way, the drain terminal of the PMOS transistor M12 is connected to the resistor R01 at the node N4 between the power supply voltage VDD and the ground terminal. And, the gate terminal of the PMOS transistor M11 is connected to the node N4 and the gate terminal of the PMOS transistor M12 is connected to the node N3 respectively.

FIG. 7 shows a circuit configuration where "H" is output to the output terminal OUT1 if the resistance value of the resistor R01 is larger than the resistance value of the Rref, and "L" is output to the output terminal OUT1 if the resistance value of the resistor R01 is smaller than the resistance value of the Rref. In addition, an inverted value of the output terminal OUT1 is output to the output terminal OUT2. If the relationship between the resistance value R' of the resistor Rref and the resistance value R of the resistor R01 is set so as to become R<R'<a ×R(a>1), at this time, the output status can be changed between when the chip is cracked and when not cracked. Because the current does not flow steadily in this configuration, the power consumption can be reduced favorably.

Although the resistor R01 is connected to the ground terminal side as shown in FIG. 3 in the above configuration, the connections of the resistor R01 and the current source I01 can be changed reversely in FIG. 3 to obtain the same function. Also in FIG. 4, the resistor R01 can be connected to the power supply voltage terminal VDD and the NMOS transistor Mi1 in which the gate terminal and the drain terminal are connected to each other can be connected to the ground terminal side to realize the same function. This is also true in FIG. 5 and in FIG. 7 respectively.

Figure 8:
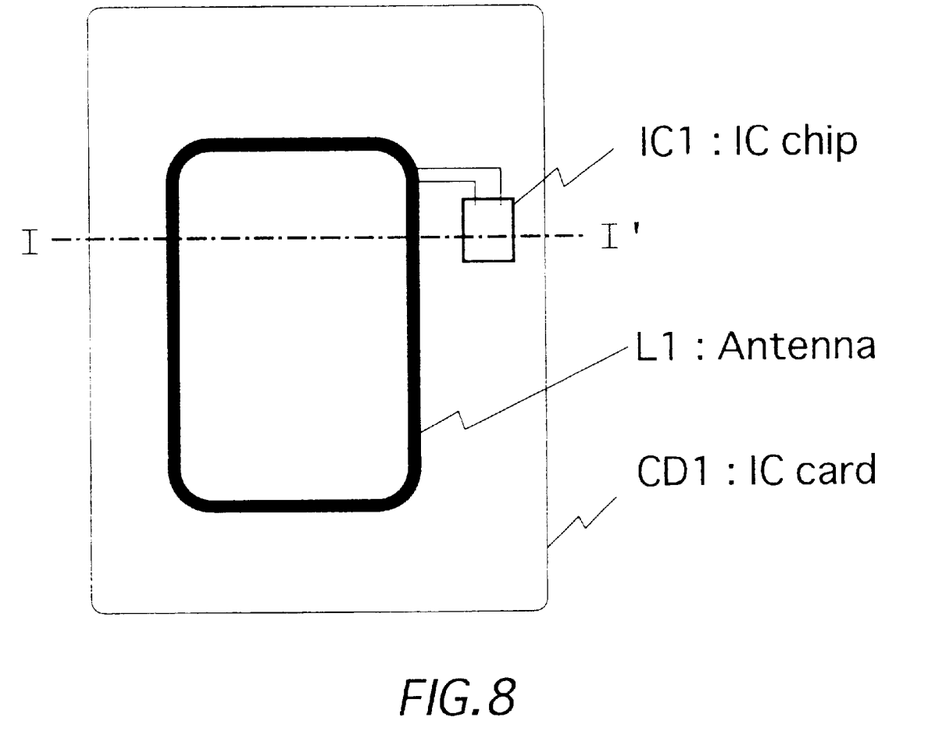
FIG. 8 is a top view of a configuration of an IC card.

FIG. 8 shows an IC card provided with an IC chip thereon, used to detect chip cracks as described above. The IC card comprises an antenna L1 and an IC chip IC1. Signals can be entered/output to/from the IC card according to the signal entered to the antenna L1. The IC chip IC1 processes those signals.

Figure 9:
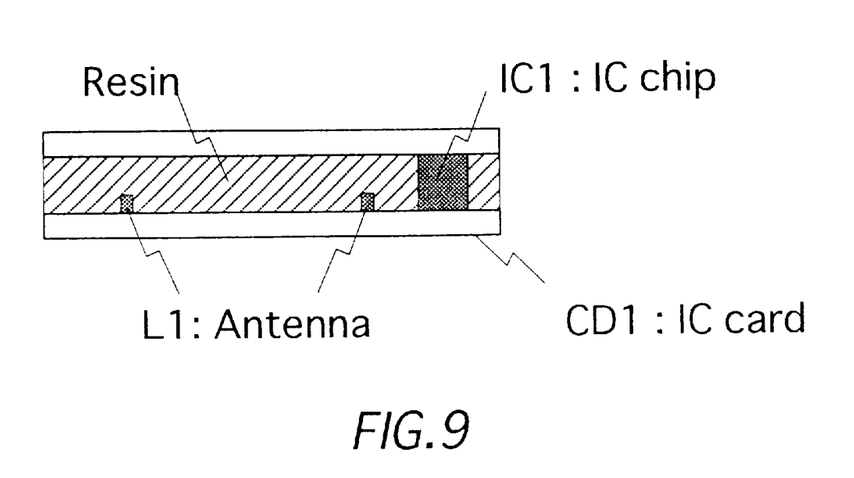
FIG. 9 is a A–A' cross sectional view of the IC card shown in FIG. 8.

FIG. 9 shows the A–A' cross sectional view of the IC card shown in FIG. 8. As shown in FIG. 9, the chip IC1 mounted on the IC card is fixed by means of resin or the like, so that the chip is kept in close contact with the IC card in the cross section even when the chip is cracked in the case where IC card is bent or pressed. Consequently, an element which is expected to have been broken is kept abnormally in contact with the chip. This is why the IC card malfunctions.

In addition to the example shown in FIG. 9, in which the chip IC1 is fixed by means of resin, there are also some other methods proposed. For example, the IC chip is embedded in a recess formed in the card board or the IC chip is bonded on the card board. In those examples, because the IC chip is reinforced physically with a reinforcing member whose surface is in close contact with the surface of the IC chip, erroneous operation of the IC circuit might continue even after the chip is cracked.

Figure 10:
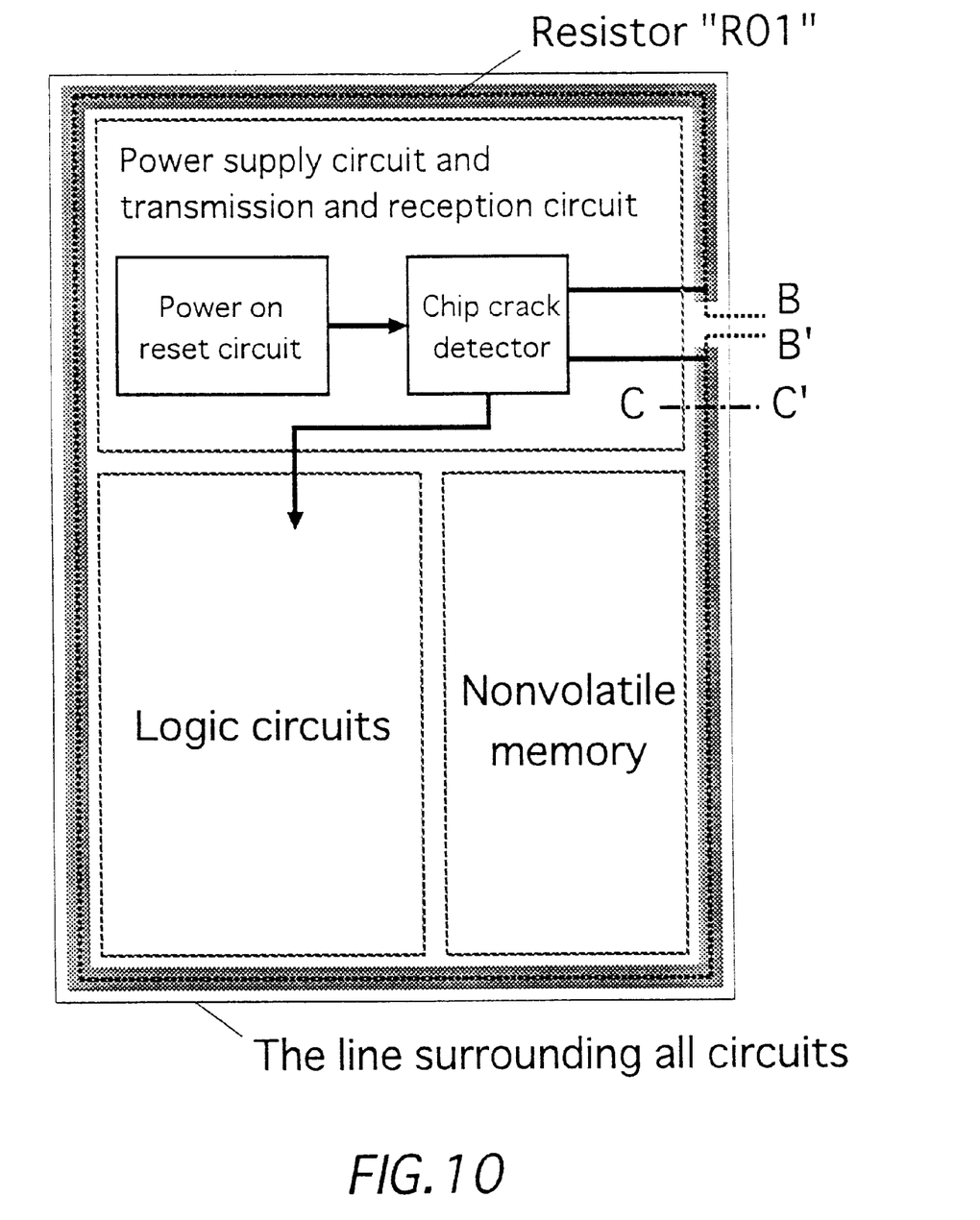
FIG. 10 is a layout of an IC card chip (LSI).

FIG. 10 shows a circuit diagram of the chip provided with aforesaid chip crack detector for preventing the IC chip from malfunction. On the chip are disposed a power supply circuit, a transmission/reception circuit, a logic circuit, and a nonvolatile memory as shown in FIG. 10. The chip is composed so that the power on reset signal generated in the power on reset circuit is passed through the chip crack detector and entered to the logic circuit.

This configuration, if the chip is cracked, prevents the input of the power on reset signal toward the logic circuit, and thereby preventing the logic circuit from such malfunction as writing of wrong data in the memory. Note *,R that a diffusion resistor is used as the resistor disposed on the line surrounding all circuits.

Figure 11:
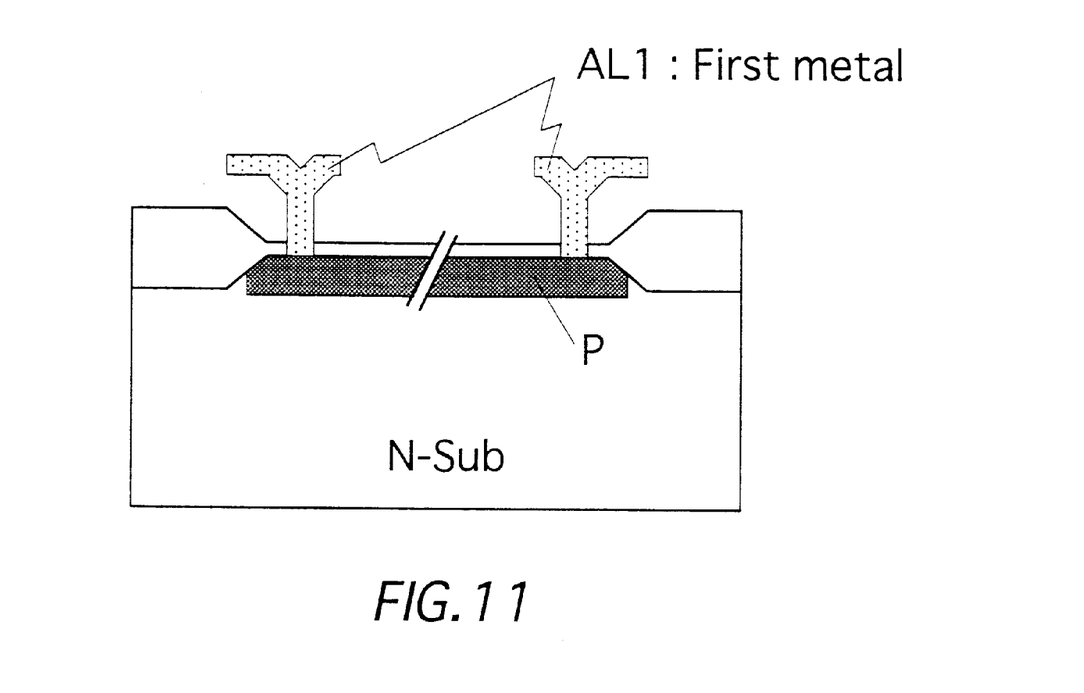
FIG. 11 is a B–B' cross sectional view of the IC card chip shown in FIG. 10.
Figure 12:
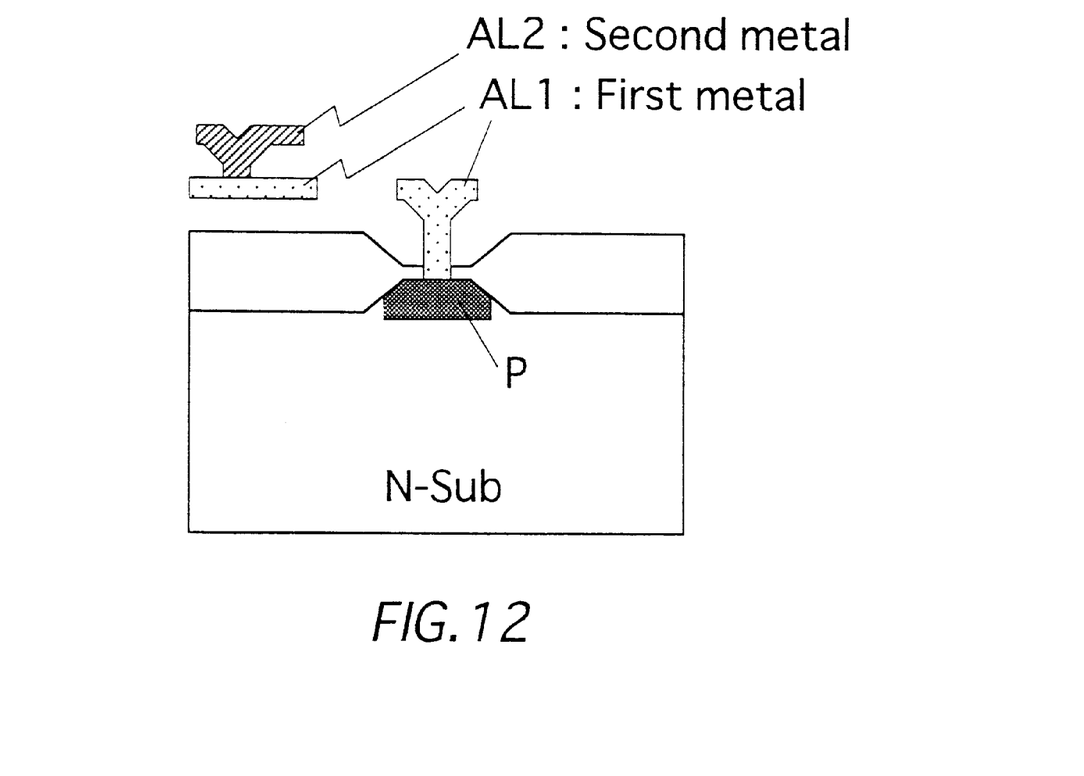
FIG. 12 is a C–C' cross sectional view of the IC card chip shown in FIG. 10.

FIGS. 11 and 12 show the B–B' and C–C' cross sectional views of the chip shown in FIG. 10. In this diffusion resistor, P-type impurities are implanted in the N substrate. Both ends of the diffusion resistor are wired to the chip crack detector with the use of the wiring layer AL1 (first layer). Because such a diffusion resistor is used, the resistor value is increased largely when the chip is cracked, and because such a diffusion resistor is disposed on the line surrounding all circuits, chip cracks can surely be detected.

Both ends of the diffusion resistor may also be connected to an external signal pad via the first layer wiring. This allows an external detector to get information about register changes, and thus is applicable to selecting non-defective chips before shipping.

The chip crack detector as described above enables to prevent a cracked chip from imperfect operations brought about through a production process or in actual practice, especially in an IC card ordinary with no shockproof. Consequently, it is possible to reduce system troubles caused by malfunctions of the LSI when the chip is cracked, as well as to improve the security of the whole system including IC cards.

In the above embodiments, both chip and card are prevented from imperfect operations if the cracked chip is detected. It is also possible to provide the chip with an indicator function for displaying a detected chip crack. However, the cards often used for security and cashing are preferably prohibited from usage if any failure is detected in them. In addition, a mere display of a chip defect would be insufficient to prevent those cards from illegal usage by the user whether it is a careless mistake or an intentional one. Taking those into consideration, therefore, this embodiment will be most desirable, since the card usage is prohibited when the cracked chip is detected.

According to the present invention, therefore, it is possible to detect whether or not the object chip is cracked by detecting a change of the resistance value of the resistor caused by a chip crack and prevent the chip circuits from malfunction to be caused by a chip crack, thereby the system security can be improved. The present invention will be suitable for "IC cards" on each of which a semiconductor integrated circuit device is mounted.

What is claimed is:

1. An IC card including:

a semiconductor chip;

a first circuit block formed on said semiconductor chip;

a conductive pattern formed on said semiconductor chip, said conductive pattern being provided along first and second edges of an area in which said first circuit block is formed, said first and second edges intersecting each other; and a second circuit block including a signal output circuit arranged to output a signal to said first circuit block and a detector for detecting a resistance value change of said conductive pattern, wherein when the resistance value of said conductive pattern is higher than a predetermined resistance value, the signal from the signal output circuit is disabled to input said first circuit block and the operation of said first circuit block is disabled.

2. An IC card in accordance with claim 1, wherein said first and second circuit blocks are formed in a predetermined area of said semiconductor chip and said conductive pattern is formed along the outer edge of the predetermined area.

3. An IC card according with claim 1, wherein said conductive pattern is formed by implanting impurities in the substrate of said semiconductor chip.

4. An IC card in accordance with claim 1, wherein the signal from the signal output circuit is transitional between a first potential according to time and a potential according to the signal supplied to said first circuit block via the detector, and wherein when the resistance value of said conductive pattern is higher than the predetermined resistance value, one of first and second potentials outputted from the detector is supplied to said first circuit block.

5. A semiconductor integrated circuit device formed on a chip including;

a logic circuit;

a conductive pattern extended at least in two directions;

a detector for detecting a resistance value change of said conductive pattern; and a control circuit for inhibiting or stopping a part or the whole operation of said logic circuit in response to the output from said detector.

6. A semiconductor integrated circuit device including:

a logic circuit block having a logic function;

a conductor pattern disposed outside said logic circuit block;

a detector for detecting a resistance change of said conductor pattern; and a control circuit for controlling whether to stop or inhibit the operation of said logic circuit block based on a result of detection by said detector.

* * * * *